United States Patent [19]

Van Eijk et al.

[11] Patent Number: 5,172,160
[45] Date of Patent: Dec. 15, 1992

[54] OPTICAL LITHOGRAPHIC DEVICE HAVING A MACHINE FRAME WITH FORCE COMPENSATION

[75] Inventors: Jan Van Eijk; Gerard Van Engelen; Hendrikus H. M. Cox; Henricus E. Beekman; Fransiscus M. Jacobs, all of Eindhoven, Netherlands

[73] Assignee: U.S. Philips Corp., New York, N.Y.

[21] Appl. No.: 784,286

[22] Filed: Oct. 29, 1991

[30] Foreign Application Priority Data

Mar. 7, 1991 [NL] Netherlands ............ 9100407

[51] Int. Cl.⁵ ............................ G03B 27/42
[52] U.S. Cl. ......................... 355/53; 355/86; 355/95; 355/236
[58] Field of Search ............ 355/53, 86, 95, 236

[56] References Cited

U.S. PATENT DOCUMENTS

| | | | |
|---|---|---|---|
| 4,595,282 | 6/1986 | Takahashi | 355/53 |
| 4,724,466 | 2/1988 | Ogawa et al. | 355/53 |
| 4,737,823 | 4/1988 | Bouwer et al. | 355/53 |
| 4,805,000 | 2/1989 | Ogawa et al. | 355/53 |

*Primary Examiner*—Monroe H. Hayes
*Attorney, Agent, or Firm*—Steven R. Biren

[57] ABSTRACT

An optical lithographic device having a machine frame (1) to which is fastened a lens system (11) having a vertical optical main axis (13). Below the lens system (11), a positioning device (35) is fastened on a support member (3) of the machine frame (1), by means of which device an object table (27) is displaceable relative to the lens system (11) over a guide surface (5) of the support member (3) extending perpendicular to the optical main axis (13).

The device is provided with a force actuator system (67) fastened to a reference frame (83) and controlled by a feedforward control system (95). The force actuator system (67) exerts a compensatory force on the support member (3) with a direction opposite to a direction of a reaction force simultaneously exerted by the positioning device (35) on the support member (3), and with a value which is substantially equal to a value of the said reaction force. The control system (95) further comprises a negative acceleration feedback (107), whereby the force actuator system (67) exerts a control force on the support member (3) which is determined by an acceleration of the support member (3) measured by an acceleration transducer (111, 113, 115). The use of the force actuator system (67) prevents undesirable movements of the support member (3) under the influence of a reaction force exerted by the positioning device (35) on the support member (3) and under the influence of external forces.

The optical lithographic device can be used inter alia for illuminating semiconductor substrates, where a semiconductor pattern provided on a mask (17) is imaged on a semiconductor substrate (25), which is positioned on the object table (27), by means of the lens system (11).

10 Claims, 8 Drawing Sheets

OPTICAL LITHOGRAPHIC DEVICE HAVING A MACHINE FRAME WITH FORCE COMPENSATION

BACKGROUND OF THE INVENTION

The invention relates to an optical lithographic device with a lens system which has a vertical optical main axis directed parallel to a z-direction and which is fastened to a machine frame of the device, as well as a positioning device which is situated below the lens system and by means of which an object table is displaceable relative to the lens system over a guide surface of a support member coupled to the positioning device, which guide surface extends perpendicular to the z-direction.

An optical lithographic device of the kind mentioned in the opening paragraph is known from U.S. Pat. No. 4,737,823. In this known optical lithographic device, the support member is a rectangular granite slab which forms a base of the machine frame of the device. Four columns of the machine frame extending in the z-direction are fastened on the guide surface which is formed by an upper side of the granite slab. The lens system is fastened to the four columns by means of a horizontal mounting plate at some distance above the granite slab. At a lower side, the granite slab is provided with lower frame supports which are each provided with spring members and damping members. The machine frame of the known optical lithographic device is spring-mounted with low frequency in directions parallel to the z-direction and transverse to the z-direction relative to a bottom surface on which the device is positioned by means of the lower frame supports, a mass spring system formed by the machine frame and the lower frame supports having mechanical natural frequencies of 2 to 4 Hz. The use of the lower frame supports prevents undesirable high-frequency vibrations of the bottom surface being transmitted through the lower frame supports to the machine frame.

A disadvantage of the known optical lithographic device is that the mechanical natural frequencies of the mass spring system formed by the machine frame and the lower frame supports are lower than the frequency of a stepwise movement performed by the object table during operation under the influence of an alternating driving force supplied by the positioning device. An alternating reaction force determined by the driving force and exerted on the machine frame by the positioning device accordingly results in a swinging movement of the machine frame relative to the bottom surface, which adversely affects the accuracy of the optical lithographic device.

SUMMARY OF THE INVENTION

It is an object of the invention to provide an optical lithographic device in which the said disadvantage is avoided as much as possible.

The optical lithographic device according to the invention is for this purpose characterized in that the device is provided with a force actuator system which is fastened to a reference frame of the device and is controlled by a feedforward control system, whereby the force actuator system during operation exerts a compensatory force on the machine frame with a direction which is opposed to a direction of a reaction force exerted simultaneously on the support member by the positioning device, and with a value which is substantially equal to a value of the said reaction force. Movements of the machine frame owing to the reaction force exerted by the positioning device on the support member are prevented as much as possible through the use of the said force actuator system, the reference frame being arranged in a fixed position relative to a bottom surface on which the device is placed. It should be noted that the term "substantially" used with reference to the value of the compensatory force is used to take into account differences which occur in practice between the compensatory force and the reaction force, inter alia as a result of tolerances both in the mechanical and in the electrical parts of the device. Wherever the term "equal" is used in this connection it should be understood to mean herinafter "substantially equal" in the sense as explained above. A special embodiment of the optical lithographic device according to the invention, in which the support member forms a base of the machine frame and in which the compensatory force is exerted on the machine frame at a practical and effective position, is characterized in that the force actuator system exerts the compensatory force on the support member.

A further embodiment of the optical lithographic device according to the invention, in which the lens system is fastened near a lower side to a mounting member belonging to the machine frame, and in which the compensatory force is exerted on the machine frame, which has a compact construction seen in the z-direction, at a practical and effective position, is characterized in that the force actuator system exerts the compensatory force on a carrier suspended from the mounting member, on which carrier the positioning device and the support member have been provided as a unit.

A still further embodiment of the optical lithographic device according to the invention, which provides a compact arrangement of the reference frame relative to the machine frame, is characterized in that the reference frame is formed by a base of the optical lithographic device on which the mounting member is fastened by means of lower frame supports.

A particular embodiment of the optical lithographic device according to the invention, which provides a great bandwidth and a stable and accurate operation of the control system, is characterized in that the control system comprises a negative acceleration feedback, whereby the force actuator system exerts a control force on the machine frame which has a value and a direction which are determined by an acceleration of the machine frame measured by means of an acceleration transducer. The use of the negative acceleration feedback in addition prevents movements of the machine frame caused by forces other than the driving forces exerted by the positioning device on the object table, such as, for example, handling forces.

A further embodiment of the optical lithographic device according to the invention is characterized in that the force actuator system comprises a first and a second force actuator which each act parallel to a first displacement direction of the positioning device perpendicular to the optical main axis, and a third force actuator which acts parallel to a second displacement direction of the positioning device perpendicular to the optical main axis and perpendicular to the first displacement direction. The use of such a force actuator system with three force actuators prevents not only undesirable movements of the machine frame in the two displacement directions of the positioning device, but also an undesirable rotation of the machine frame about an axis of rotation which is parallel to the optical main axis.

A yet further embodiment of the optical lithographic device according to the invention, which provides a simple construction of the force actuator system, is characterized in that each of the force actuators is provided with an electric motor fastened to the reference frame and with a connecting rod extending parallel to the relevant displacement direction, a first rod end being eccentrically pivoted to an output shaft of the electric motor and a second rod end being pivoted to the machine frame.

A special embodiment of the optical lithographic device according to the invention, which provides a robust force actuator system which is free from mechanical wear, is characterized in that the force actuator system comprises at least one electromagnet with a magnetic flux density sensor, an electrical output of the magnetic flux density sensor being connected to an electrical input of an electronic control circuit with which a force exerted by the electromagnet is controllable. The use of such a force actuator system in addition prevents undesirable mechanical vibrations being transmitted through the reference frame to the machine frame.

A further embodiment of the optical lithographic device according to the invention is characterized in that the control circuit is provided with an electronic root extractor whose input signal is formed by an input signal of the control circuit and has a value which is determined by a desired electromagnetic force to be exerted by the electromagnet. Owing to the use of the electronic root extractor, the electromagnet forms a linear force actuator, the electromagnetic force exerted by the electromagnet having a value which is proportional to the input signal of the control circuit.

A yet further embodiment of the optical lithographic device according to the invention is characterized in that the force actuator system comprises three electromagnets which are fastened to the reference frame of the device in a triangular arrangement in a plane perpendicular to the optical main axis, each of the electromagnets being active in a direction which is 120° rotated relative to the directions in which the other two electromagnets of the force actuator system are active. The use of the three said force actuators provides a simple construction of the force actuator system, whereby undesirable movements of the machine frame in two mutually perpendicular displacement directions of the positioning device are prevented.

BRIEF DESCRIPTION OF THE DRAWING

The invention is explained in more detail below with reference to the drawing, in which.

DESCRIPTION OF THE PREFERRED EMBODIMENTS

Figure 1:
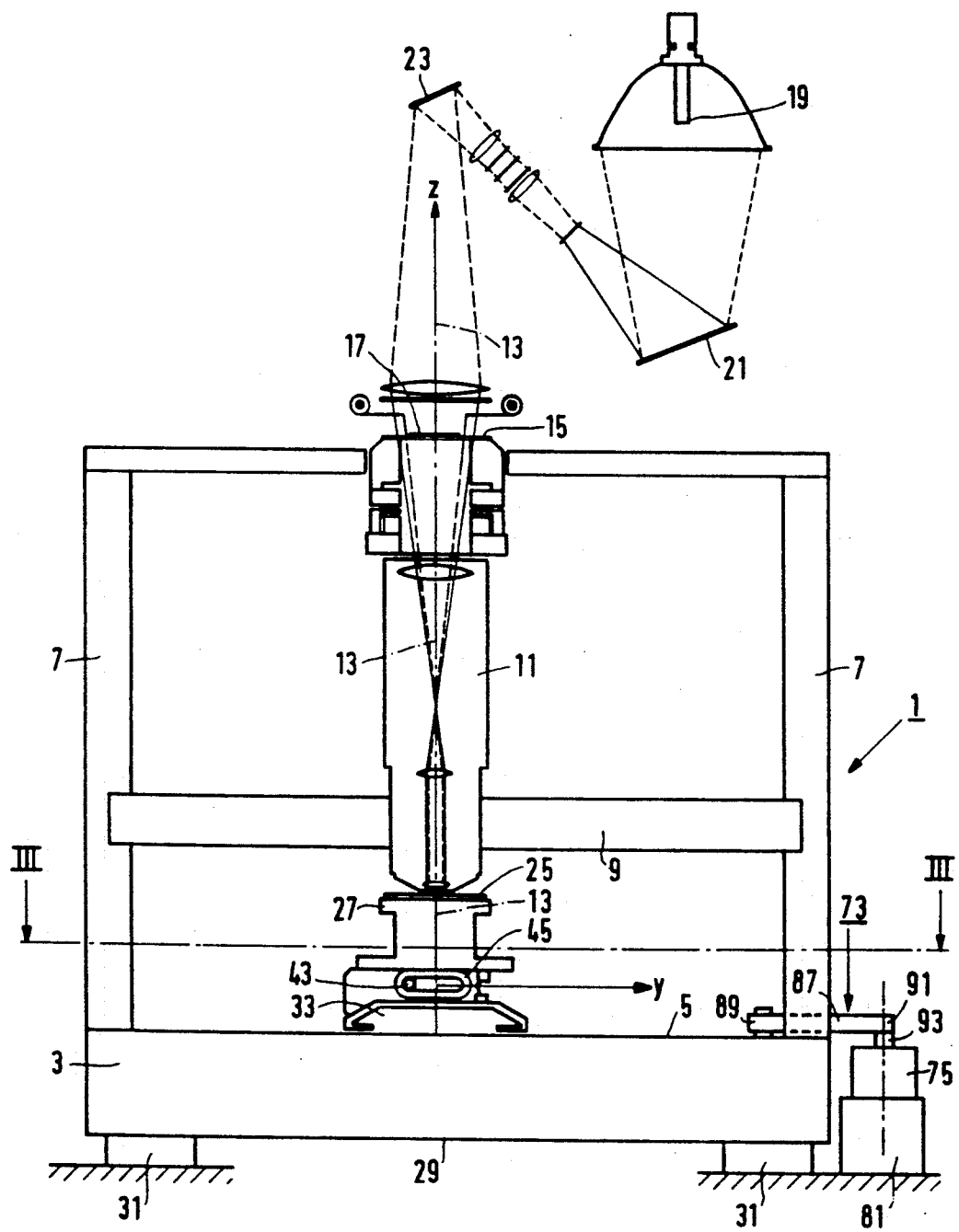
FIG. 1 diagrammatically shows a first embodiment of an optical lithographic device according to the invention.
Figure 2:
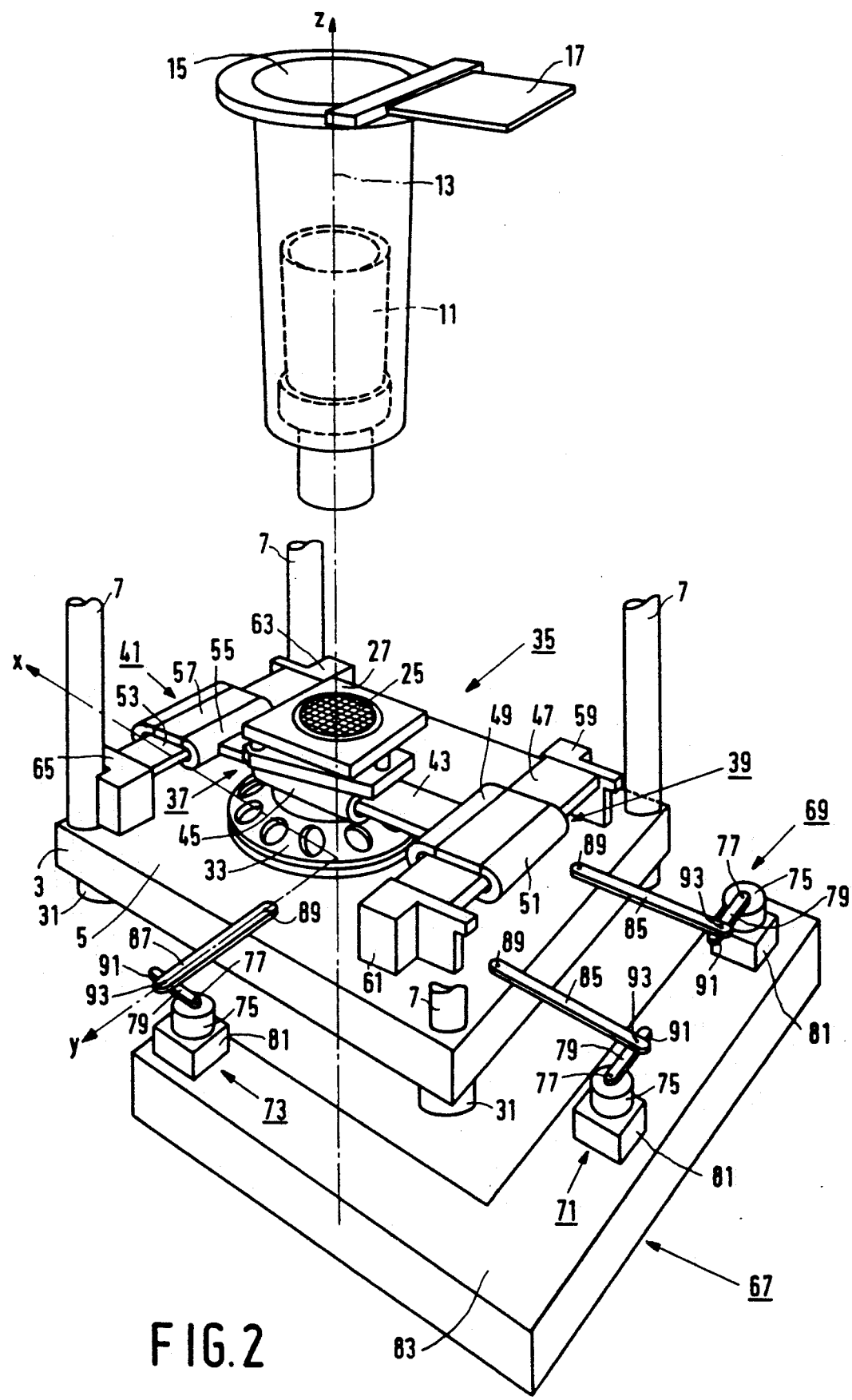
FIG. 2 shows in perspective view a portion of the first embodiment according to FIG. 1, FIG. 3 diagrammatically shows a cross-section of the first embodiment taken on the line III—III in FIG. 1.
Figure 3:
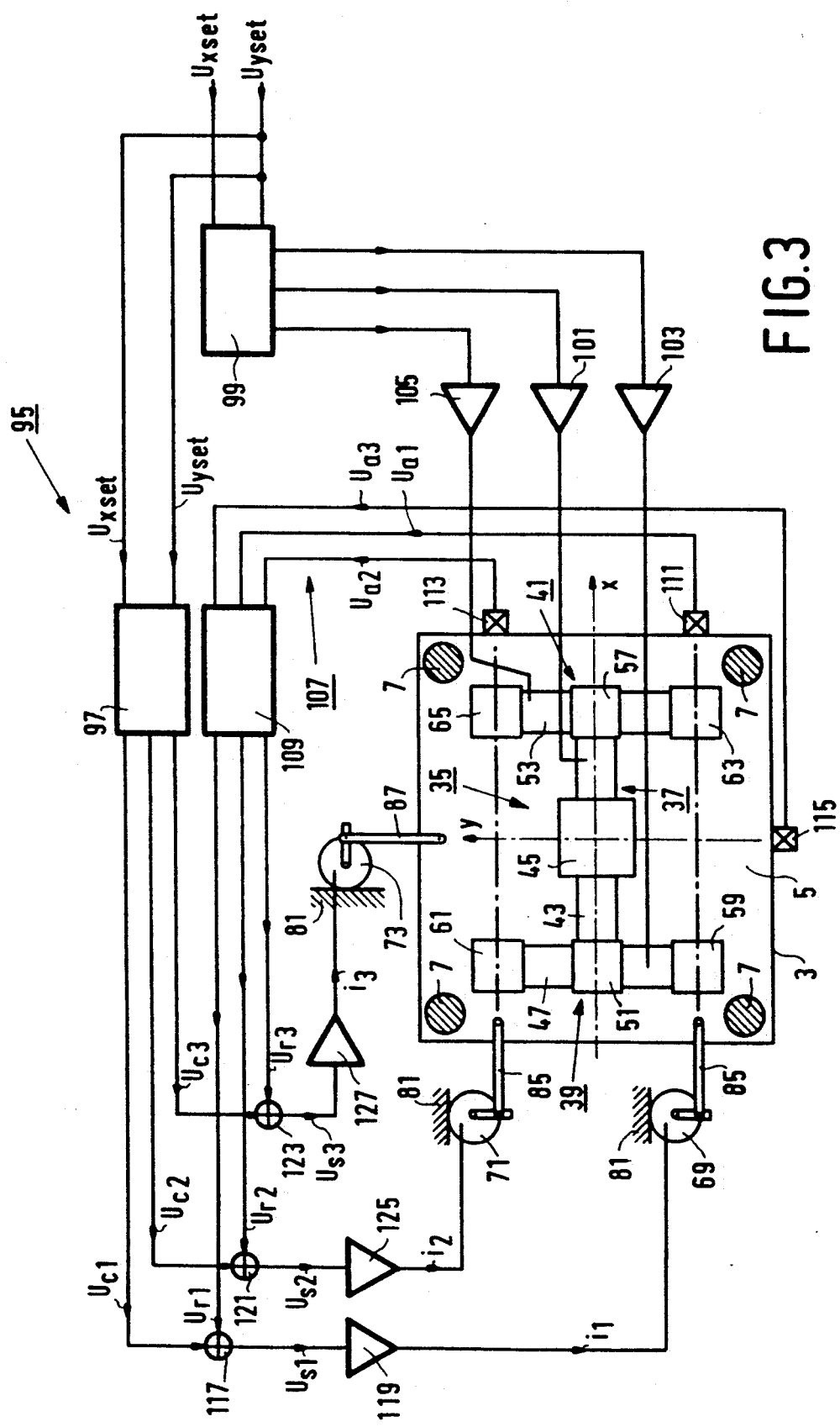

The first embodiment of the optical lithographic device illustrated in FIGS. 1 to 3 is provided with a machine frame 1 having a support member 3 which is constructed as a rectangular granite slab. The support member 3 has an upper surface 5 which extends perpendicular to a vertical z-direction indicated in FIGS. 1 and 2. Four columns 7 of the machine frame 1 are fastened on the upper surface 5, each extending parallel to the z-direction. Only two columns 7 are visible in FIG. 1, while the four columns 7 are represented in cross-section in FIG. 3. At some distance above the support member 3, the columns 7 are fastened to a mounting member 9 which is constructed as a rectangular plate extending transverse to the z-direction. The optical lithographic device is further provided with an optical lens system 11, which is indicated only diagrammatically in FIGS. 1 and 2, which has an optical main axis 13 coinciding with the z-direction, and which is fastened to the mounting member 9 near a lower side.

Near an upper side of the lens system 11, the optical lithographic device is provided with a mask manipulator 15 for positioning and supporting a mask 17 relative to the lens system 11. During operation, a light beam coming from a light source 19 is guided along mirrors 21 and 23 through the mask 17 which comprises, for example, a pattern of an integrated semiconductor circuit, and is focused on a substrate by means of the lens system 11, for example, on a semiconductor substrate 25 which is placed on an object table 27 of the optical lithographic device. In this way, the said pattern is imaged on the semiconductor substrate 25 on a reduced scale. The object table 27 is displaceable parallel to an x-direction represented in FIGS. 2 and 3 which is perpendicular to the z-direction, and parallel to a y-direction which is perpendicular to the z-direction and to the x-direction. The semiconductor substrate 25 can be illuminated in a large number of locations corresponding to identical integrated circuits by means of a stepwise displacement of the object table 27 parallel to the x-direction and the y-direction to various illumination positions.

As is shown in FIG. 1, the support member 3 is provided at a lower side 29 with four lower frame supports 31 by means of which the optical lithographic device is positioned on a flat base surface. Only two lower frame supports 31 are visible in FIG. 1. The optical lithographic device is spring-supported relative to the base surface in directions parallel to the z-direction and transverse to the z-direction with low frequency by means of the lower frame supports 31, which are each provided with spring members and damping members not shown in any detail in FIG. 1, the mass spring system formed by the machine frame 1 and the lower frame supports 31 having six mechanical natural frequencies between 1 and approximately 20 Hz. It is prevented in this way that undesirable high-frequency vibrations of the base surface, which adversely affect an accurate operation of the optical lithographic device, are transmitted through the lower frame supports 31 to the machine frame 1 and the lens system 11.

As is shown in detail in FIG. 2, the object table 27 is guided over the upper surface 5 of the support member 3 by means of a so-called aerostatic foot 33, which is provided with a static gas bearing. The object table 27 is movable over the upper surface 5 by means of a positioning device 35 which comprises three linear electric motors 37, 39 and 41. As is shown in FIG. 2, the linear motor 37 comprises an x-stator 43 extending parallel to the x-direction and an x-translator 45 fastened to the object table 27 by which the object table 27 is displaceable along the x-stator 43 parallel to the x-direction. The linear motors 39 and 41 comprise a y-stator 47 extending parallel to the y-direction with a y-translator 51 fastened to a first end 49 of the x-stator 43, and a y-stator 53 extending parallel to the y-direction with a y-translator 57 fastened to a second end 55 of the x-stator 43, respectively. The y-stators 47 and 53 are fastened on the upper surface 5 of the support member 3 by means of mounting blocks 59, 61 and mounting blocks 63, 65, respectively. The object table 27 is displaceable parallel to the y-direction and rotatable through a very limited angle about an axis of rotation extending parallel to the z-direction by means of the linear motors 39 and 41. It is noted that the aerostatic foot 33 and the positioning device 35 with the linear motors 37, 39, 41 arranged relative to one another in an H-shape are known per se from U.S. Pat. No. 4,737,823.

During operation, as was noted above, the object table 27 is displaced stepwise in directions parallel to the x-direction and parallel to the y-direction by means of the positioning device 35. The said stepwise displacement takes place with a frequency of 2 Hz–4 Hz. The linear motors 37, 39, 41 of the positioning device 35 thereby exert on the support member 3 of the machine frame 1 a low-frequency reaction force which is oppositely directed to a driving force exerted by the linear motors 37, 39, 41 on the object table 27. Since the optical lithographic device, as was stated above, is spring-supported with low frequency relative to the base surface by means of the lower frame supports 31, the said reaction force causes a low-frequency, badly damped swinging movement of the machine frame 1 on the lower frame supports 31 unless further measures are taken. The said movement of the machine frame 1 adversely affects the accuracy of the positioning device 35.

In the optical lithographic device according to FIGS. 1 to 3, the swinging movement of the machine frame 1 referred to above is prevented by the use of a force actuator system 67 diagrammatically shown in FIGS. 2 and 3. The force actuator system 67 is provided with a first and a second force actuator 69 and 71, which each act in a direction parallel to the x-direction, and a third force actuator 73 which acts in the y-direction. As FIG. 2 shows, each of the force actuators 69, 71, 73 is provided with a brushless electric servomotor 75 with an output shaft 77 which extends parallel to the z-direction and which is provided with a crank arm 79 near an end. The crank arms 79 of the first and the second force actuator 69 and 71 are directed parallel to the y-direction, whereas the crank arm 79 of the third force actuator 73 is directed parallel to the x-direction. The servomotors 75 are each fastened to a mounting block 81 which forms part of a reference frame 83 which occupies a fixed position relative to the base surface. Furthermore, the first and the second force actuator 69 and 71 are each provided with a connecting rod 85 which extends parallel to the x-direction, while the third force actuator 73 is provided with a connecting rod 87 extending substantially in the y-direction. A first end 89 of each of the connecting rods 85, 87 is pivoted to the support member 3, while a second end 91 of each of the connecting rods 85, 87 is pivoted to a hinge pin 93 which is fastened to the crank arm 79 of the corresponding servo motor 75 eccentrically relative to the output shaft 77.

During operation the force actuator system 67 with the force actuators 69, 71, 73 exerts a compensatory force on the support member 3 whose value and direction are controlled by means of a feedforward control system 95 depicted diagrammatically in FIG. 3. The control system 95 is provided with a first electronic controller 97 with input signals $u_{xset}$ and $u_{yset}$ (voltage signals). The signals $u_{xset}$ and $u_{yset}$, whose values are proportional to the values of a desired displacement of the object table 27 relative to the lens system 11 in the x-direction and the y-direction and which are supplied by a computer system of the device controlling the lithographic process of the device (not shown in FIG. 3), each also form an input signal for an electronic control unit 99 which during operation controls the linear motors 37, 39 and 41 of the positioning device 35 via an amplifier unit 101, an amplifier unit 103, and an amplifier unit 105, respectively. A transducer system which measures the actual displacement of the object table 27 relative to the lens system 11 in the x-direction and the y-direction and feeds this back to the control unit 101 has not been depicted in FIG. 3 for the sake of simplicity.

The first controller 97 computes from the input signals $u_{xset}$ and $u_{yset}$ consecutively the values of an acceleration of the object table 27 parallel to the x-direction and to the y-direction, respectively, the values of the reaction forces $F_{rx}$ and $F_{ry}$ parallel to the x-direction and the y-direction, respectively, resulting from the said accelerations and exerted on the support member 3 by the positioning device 35, and the value of a mechanical moment $M_{rxy}$ about the optical main axis 13 exerted by the reaction forces $F_{rx}$ and $F_{ry}$. A first and a second output signal $u_{c1}$ and $u_{c2}$ of the first controller 97 (voltage signals) have values proportional to a compensatory force $F_{c1}$ to be supplied by the first force actuator 69 and a compensatory force $F_{c2}$ to be supplied by the second force actuator 71, respectively, parallel to the x-direction, while a third output signal $u_{c3}$ of the first controller 97 (voltage signal) has a value proportional to a compensatory force $F_{c3}$ to be supplied by the third force actuator 73 in the y-direction. The values of the output signals $u_{c1}$ and $u_{c2}$ are such that the sum of the compensatory forces $F_{c1}$ and $F_{c2}$ is equal in value and opposite in direction to the reaction force $F_{rx}$ and that a mechanical moment $M_{cxy}$ about the optical main axis 13 exerted by the compensatory forces $F_{c1}$ and $F_{c2}$ is equal in value and opposite in direction to the mechanical moment $M_{rxy}$. The value of the output signal $u_{c3}$ is such that the compensatory force $F_{c3}$ is equal in value and opposite in direction to the reaction force $F_{ry}$. It should be noted that the compensatory force $F_{c3}$ is active in a plane which goes through the optical main axis 13 and thus exerts no mechanical moment about the optical main axis 13. It is thus prevented by means of the force actuator system 67 controlled by the feedforward control system 95 that the support member 3 and the machine frame 1 perform undesirable movements under the influence of the reaction forces exerted by the linear motors 37, 39, 41 of the positioning device 35 on the support member 3.

As is shown in FIG. 3, the control system 95 further comprises a negative feedback 107 which is provided with a second electronic controller 109 with input signals $u_{a1}$, $u_{a2}$ and $u_{a3}$ (voltage signals). The input signals $u_{a1}$ and $u_{a2}$ are derived from a first acceleration transducer 111 and a second acceleration transducer 113, respectively, and are each of a value proportional to an absolute acceleration of the support member 3 in a direction parallel to the x-direction as measured by the relevant acceleration transducer 111, 113. The input signal $u_{a3}$ is derived from a third acceleration transducer 115 and has a value proportional to an absolute acceleration of the support member 3 in the y-direction as measured by the acceleration transducer 115. The second controller 109 computes from the input signals $u_{a1}$, $u_{a2}$, $u_{a3}$ an acceleration of the support member 3 in the x-direction and in the y-direction as well as an angular acceleration of the support member 3 about the optical main axis 13. A first and a second output signal $u_{r1}$ and $u_{r2}$ of the second controller 109 (voltage signals) have values proportional to a control force $F_{r1}$ to be supplied by the first force actuator 69 and a control force $F_{r2}$ to be supplied by the second force actuator 71, respectively, both parallel to the x-direction, while a third output signal $u_{r3}$ of the second controller 109 (voltage signal) has a value which is proportional to a control force $F_{r3}$ to be supplied by the third force actuator 73 in the y-direction. The values of the output signals $u_{r1}$, $u_{r2}$, $u_{r3}$ are such that the accelerations of the support member 3 in the x-direction and the y-direction measured by the acceleration transducers 111, 113, 115 and the measured angular acceleration of the support member 3 about the optical main axis 13 are damped under the influence of the control forces $F_{r1}$, $F_{r2}$ and $F_{r3}$. The application of the negative feedback 107 prevents the support member 3 and the machine frame 1 performing undesirable movements or vibrations parallel to the x-direction and the y-direction, which could arise under the influence of forces other than the reaction forces of the positioning device 35 mentioned, such as, for example, handling forces, or under the influence of low-frequency vibrations of the base surface. As is further shown in FIG. 3, the control system 95 is provided with a first summation circuit 117 with an output signal $u_{s1}$, whose value is equal to the sum of the signals $u_{c1}$ and $u_{r1}$, and which is amplified by an amplifier unit 119 to a current $i_1$ through the first force actuator 67. A second and a third summation circuit 121 and 123 of the control system 95 have output signals $u_{s2}$ and $u_{s3}$, respectively, whose values are equal to the sums $u_{c2}+u_{r2}$ and $u_{c3}+u_{r3}$, respectively. The signals $u_{s2}$ and $u_{s3}$ are amplified by amplifier units 125 and 127 to a current $i_2$ through the second force actuator 71 and a current $i_3$ through the third force actuator 73, respectively. The use of the summation circuits 117, 121, 123 achieves that each of the force actuators 69, 71, 73 exerts a force on the support member 3 which is equal to the sum of the compensatory force $F_{c1}$, $F_{c2}$, $F_{c3}$ and the control force $F_{r1}$, $F_{r2}$, $F_{r3}$ to be exerted by the respective force actuator 69, 71, 73.

FIGS. 4 to 8 show the second embodiment of the optical lithographic device according to the invention, in which the components corresponding to the first embodiment of the optical lithographic device shown in FIGS. 1 to 3 are given the same reference numerals. The second embodiment of the optical lithographic device is provided with an optical lens system 11 which has an optical main axis 13 coinciding with a z-direction and which is fastened near a lower side to a mounting member 9. The mounting member 9 which forms part of a machine frame 1 of the device is constructed as a triangular plate which extends in a plane perpendicular to the z-direction. Near an upper side of the lens system 11, the device is provided with a mask manipulator 15 for a mask 17 comprising, for example, a pattern of an integrated semiconductor circuit, a light source 19, and two mirrors 21 and 23. Similar to the device according to the first embodiment, the device according to the second embodiment is further provided with an object table 27 on which a substrate can be positioned, such as, for example, a semiconductor substrate 25. The object table 27 is displaceable stepwise parallel to an x-direction which is perpendicular to the z-direction and parallel to a y-direction which is perpendicular to the z-direction and the x-direction, so that the semiconductor substrate 25 can be illuminated in a large number of different illumination positions.

The triangular mounting member 9 is provided with three corner parts 129 which each rest on a lower frame support 31. Only two corner parts 129 and two lower frame supports 31 are visible in FIG. 4. The lower frame supports 31 are positioned on a base 131 of the machine frame 1, which is positioned on a flat foundation by means of adjustment members 133. The device is spring-supported with low frequency relative to the foundation in directions parallel to the z-direction and transverse to the z-direction by means of the lower frame supports 31, which are each provided with spring members and damping members not shown in any detail in FIG. 4, so that an undesirable transmission of high-frequency vibrations of the foundation through the lower frame supports 31 to the mounting member 9 and the lens system 11 is prevented.

Figure 4:
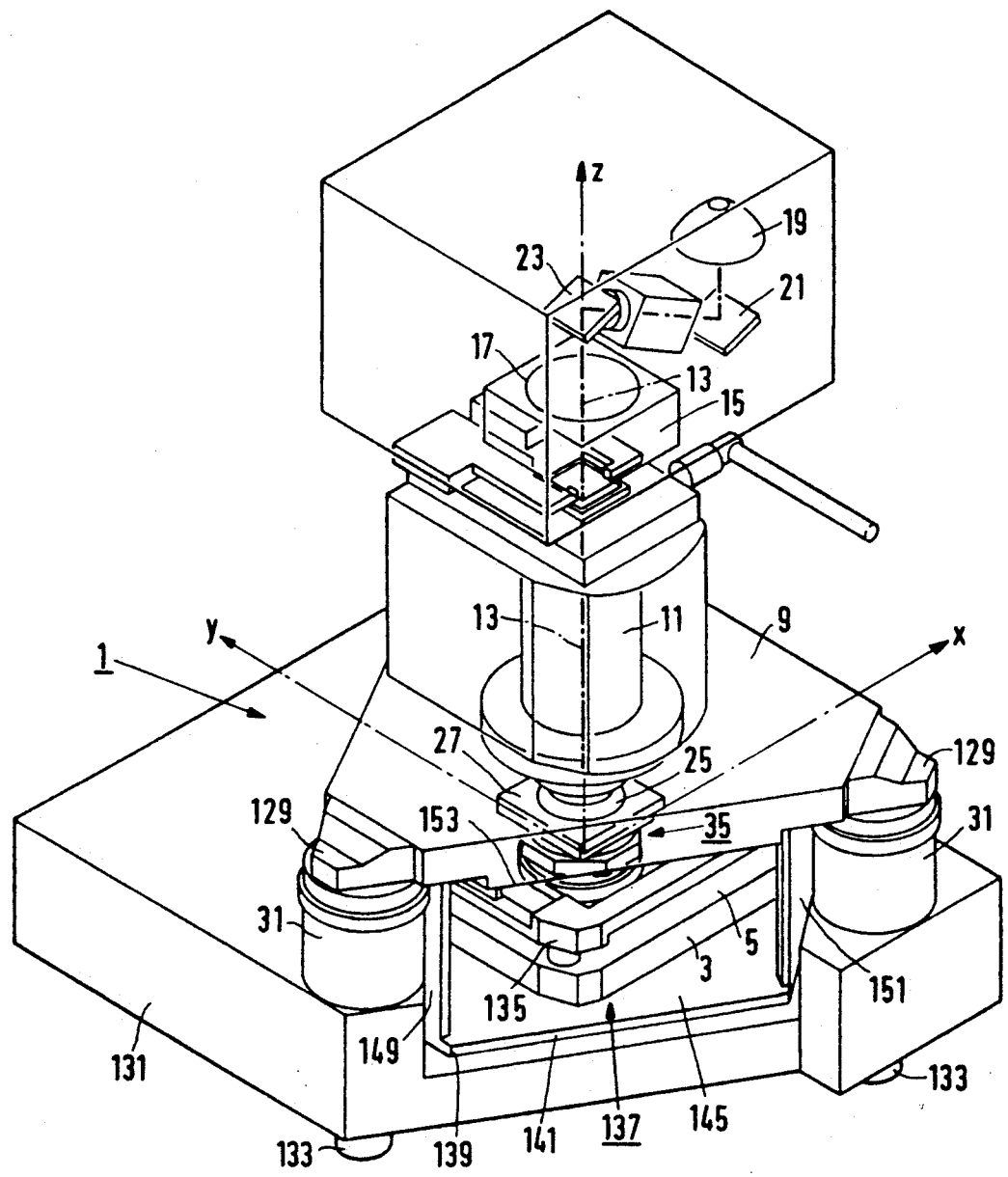
FIG. 4 shows a perspective view of a second embodiment of an optical lithographic device according to the invention.
Figure 5:
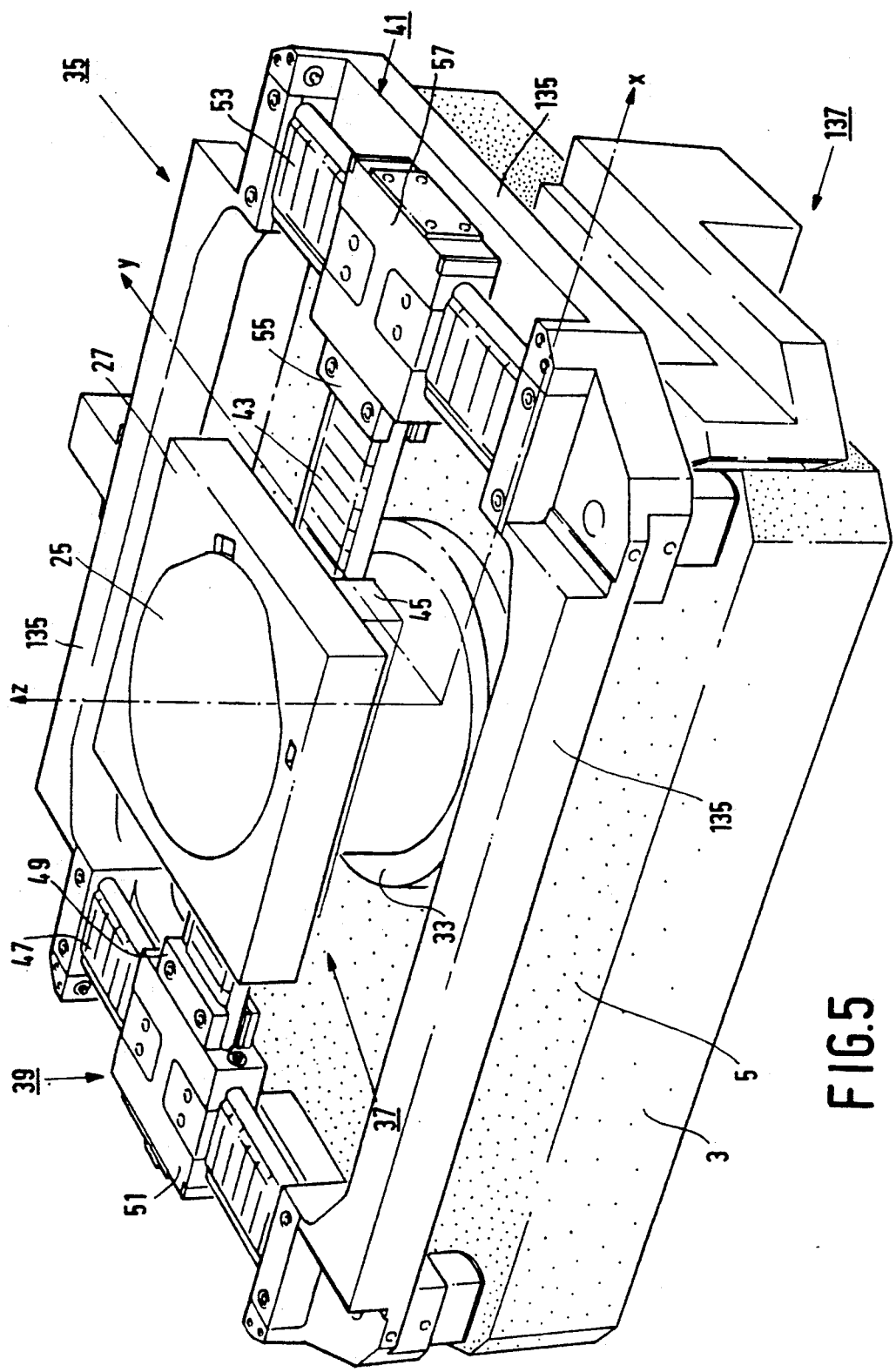
FIG. 5 shows a unit formed by a positioning device and a support member of the second embodiment according to FIG. 4, FIG. 6 diagrammatically shows a cross-section of the second embodiment according to FIG. 4.

As in the optical lithographic device according to FIGS. 1 to 3, the object table 27 in the device according to FIGS. 4 to 8 is guided along an upper surface 5 of a support member 3 constructed as a rectangular granite slab by means of an aerostatic foot 33 depicted in FIG. 5 and provided with a static gas bearing. The object table 27 is displaceable over the upper surface 5 by means of a positioning device 35 which is provided with the linear motors 37, 39 and 41 which were already mentioned above, are known from U.S. Pat. No. 4,737,823, and are positioned relative to one another in an H-arrangement. As is shown in FIG. 5, the linear motors 39 and 41 are fastened to a frame 135 of the positioning device 35, which is fastened near its corners on the upper surface 5 of the support member 3. The object table 27 is displaceable parallel to the x-direction by the linear motor 37, while the object table 27 is displaceable parallel to the y-direction and rotatable through a very limited angle about an axis of rotation parallel to the z-direction by the linear motors 39 and 41.

Figure 6:
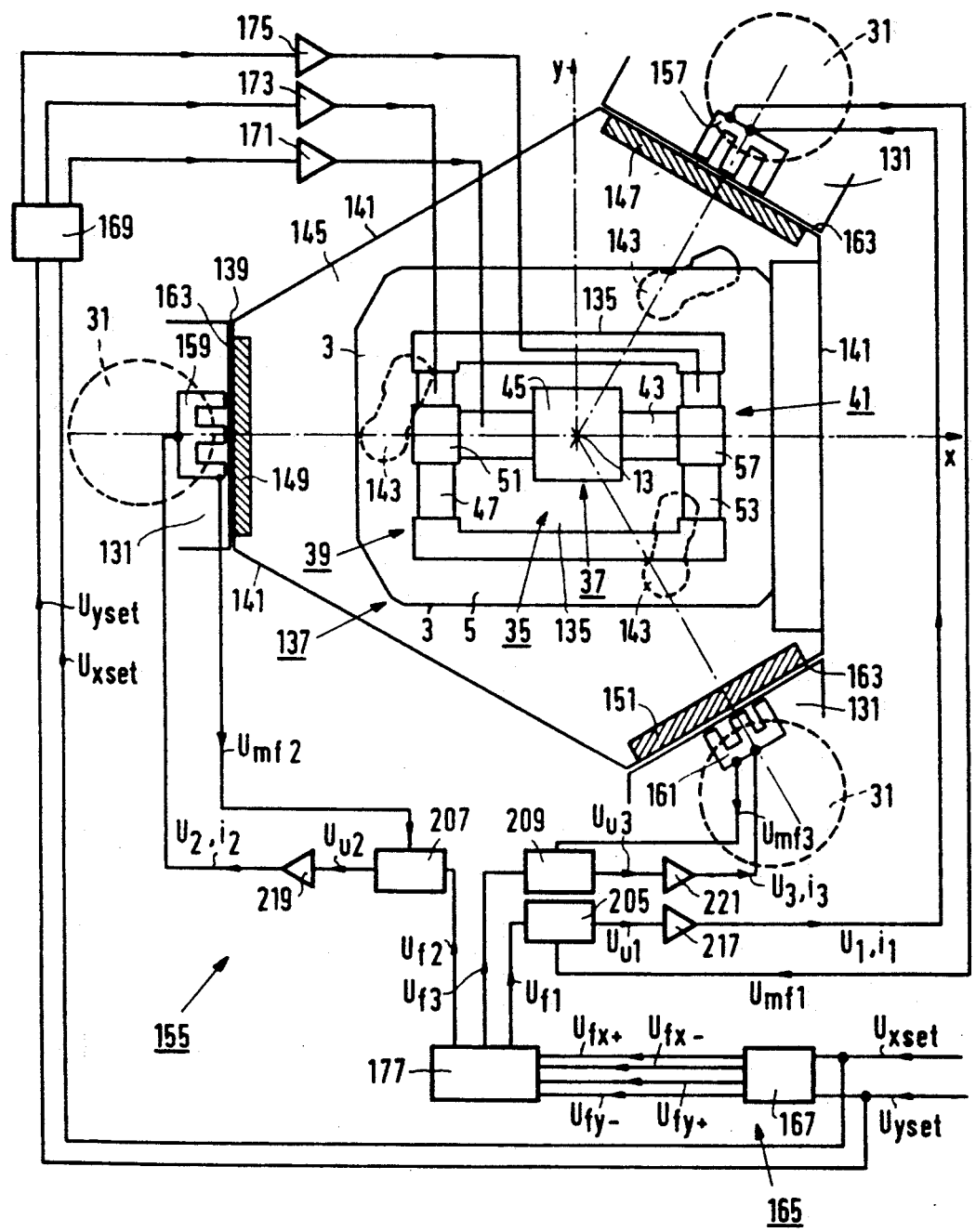

As is shown in FIGS. 4 and 5, the support member 3 and the positioning device 35 in the optical lithographic device according to the second embodiment constitute a unit 137 which is provided on a carrier 139 of the machine frame 1. FIG. 6 shows that the carrier 139 is formed by a substantially triangular plate which extends perpendicular to the z-direction and has main sides 141 which each extend between two lower frame carriers 31. The support member 3 is fastened on an upper side 145 of the carrier 139 by means of three fastening members 143 shown only diagrammatically in FIG. 6. The carrier 139 is suspended from a lower side 153 of the mounting member 9 indicated in FIG. 4 by means of three plate-shaped steel suspension elements 147, 149 and 151. In FIG. 4 the suspension elements 149 and 151 only are partly visible, while FIG. 6 shows the suspension elements 147, 149 and 151 in cross-section. The suspension elements 147, 149 and 151 are each formed by a plate which extends in a vertical plane parallel to the z-direction, the said vertical planes enclosing angles of 60° with each other. The use of the suspension elements 147, 149 and 151 provides a suspended construction of the carrier 139 from the mounting member 9 whereby the unit 137 formed by the support member 3 and the positioning device 35 is positioned between the lower frame supports 31. A compact and rigid construction of the optical lithographic device is obtained in this way, seen both in the z-direction and transverse to the z-direction.

A stepwise displacement of the object table 27 in directions parallel to the x-direction and parallel to the y-direction takes place with a frequency of 2 Hz–4 Hz in the device pictured in FIG. 4 as well as in the device pictured in FIG. 1. The linear motors 37, 39 and 41 of the positioning device 35 then exert a low-frequency reaction force on the carrier 139 of the machine frame 1 via the support member 3, which force is oppositely directed to a driving force exerted by the linear motors 37, 39 and 41 on the object table 27. In the optical lithographic device pictured in FIGS. 4 to 8, undesirable movements of the machine frame 1 resulting from the said reaction force are prevented through the use of a force actuator system 155 diagrammatically shown in FIG. 6. The force actuator system 155 is provided with three electromagnets 157, 159 and 161 which are fastened to the base 131 of the machine frame 1 each below one of the three lower frame supports 31. The base 131, which is set in a fixed position relative to the foundation by means of the adjustment members 133, in this way forms a reference frame of the device for fastening of the force actuator system 155. As is shown in FIG. 6, the electromagnet 159 acts in the x-direction, whereas the electromagnets 157 and 161 each act in a direction which lies in a horizontal plane transverse to the optical main axis 13 and which is rotated through 120° relative to the x-direction. During operation the electromagnets 157, 159 and 161 exert an attracting electromagnetic force on a side of the respective suspension element 147, 149, 151 remote from the optical main axis 13, the size of an air gap 163 between the electromagnets 157, 159, 161 and the respective suspension elements 147, 149, 151 being approximately 1 mm. As is apparent from FIG. 6, a resultant of the forces exerted by the electromagnets 157, 159 and 161 on the carrier 139 is always active in a plane through the optical main axis 13, so that a compensatory force $F_{cx}$ in the x-direction and a compensatory force $F_{cy}$ in the y-direction are exerted by the force actuator system 155 whose mechanical moment about the optical main axis 13 is always equal to zero, and undersirable rotation movements of the machine frame 1 about the optical main axis 13 cannot be prevented.

The values and the directions of the compensatory forces $F_{cx}$ and $F_{cy}$ exerted on the carrier 139 by the force actuator system 155 are controlled by means of a feedforward control system 165 shown diagrammatically in FIG. 6. The control system 165 is provided with an electronic controller 167 with input signals $u_{xset}$ and $u_{yset}$ (voltage signals). The signals $u_{xset}$ and $u_{yset}$, whose values are proportional to the extent of a desired displacement of the object table 27 over the support member 3 in the x-direction and the y-direction, are supplied by a computer system not shown in FIG. 6 which controls the lithographic process of the device, and at the same time each form an input signal for an electronic control unit 169 which during operation controls the linear motors 37, 39 and 41 of the positioning device 35 via amplifier units 171, 173 and 175 (see FIG. 6), respectively. A transducer system which measures an actual displacement of the object table 27 relative to the lens system 11 in the x-direction and the y-direction is not shown in FIG. 6 for simplicity's sake.

The electronic controller 167 calculates from the input signals $u_{xset}$ and $u_{yset}$ the value of an acceleration of the object table 27 parallel to the x-direction and the y-direction, respectively, and the values of the reaction forces $F_{rx}$ and $F_{ry}$ parallel to the x-direction and the y-direction, respectively, determined by the said accelerations and exerted on the carrier 139 by the positioning device 35 via the support member 3. A first and a second output signal $u_{fx+}$ and $u_{fx-}$ of the controller 167 (voltage signals) have values which are proportional to the compensatory force $F_{cx}$ to be supplied in the positive and negative x-direction, respectively, by the force actuator system 155, the compensatory force $F_{cx}$ having a value which is equal to and a direction which is opposed to the reaction force $F_{rx}$. A third and a fourth output signal $u_{fy+}$ and $u_{fy-}$ of the controller 167 have values which are proportional to the compensatory force $F_{cy}$ in the positive and the negative y-direction, respectively, to be supplied by the force actuator system 155, the compensatory force $F_{cy}$ having a value which is equal to and a direction which is opposed to the reaction force $F_{ry}$. The force actuator system 155 controlled by the feedforward control system 165 thus only prevents undesirable movements of the machine frame 1 parallel to the x-direction and parallel to the y-direction resulting from the reaction forces $F_{rx}$ and $F_{ry}$.

As is shown in FIG. 6, the signals $u_{fx+}$, $u_{fx-}$, $u_{fy+}$ and $u_{fy-}$ each form an input signal for an electronic summation circuit 177 with output signals $u_{f1}$, $u_{f2}$ and $u_{f3}$. Starting from the signals $u_{fx+}$, $u_{fx-}$, $u_{fy+}$ and $u_{fy-}$, the summation circuit 177 calculates the values of the electromagnetic forces $F_{em1}$, $F_{em2}$ and $F_{em3}$ to be exerted by the electromagnets 157, 159 and 161, respectively, the output signals $u_{f1}$, $u_{f2}$ and $u_{f3}$ having values which are proportional to the said electromagnetic forces.

Figure 7A:
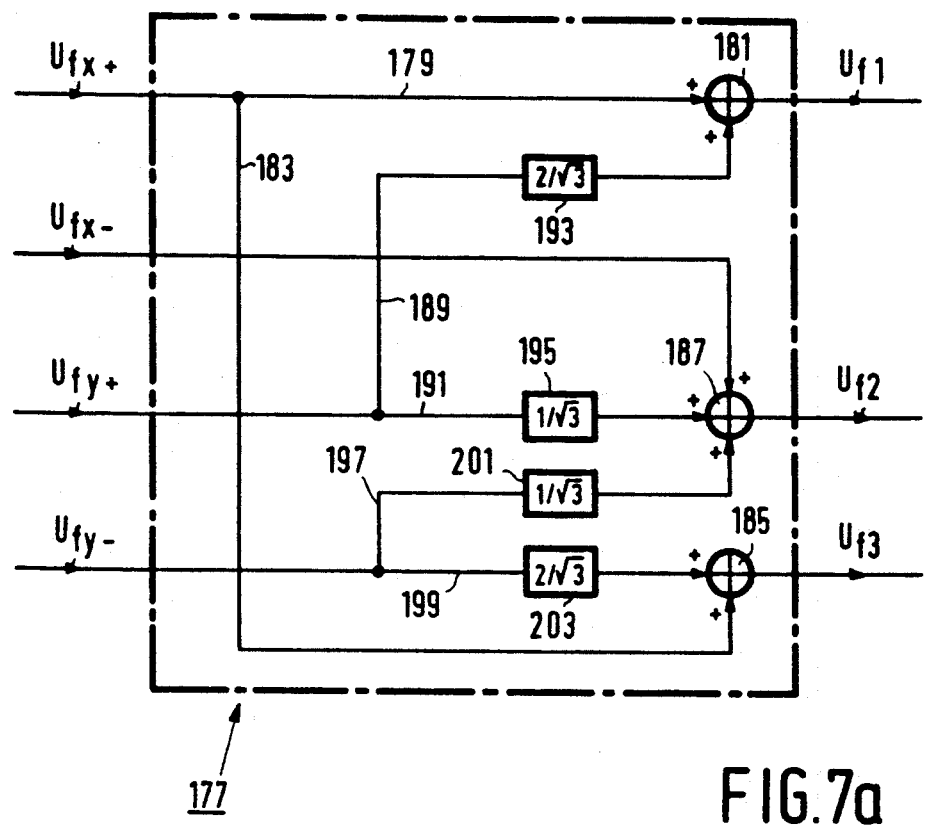
FIG. 7a shows a summation circuit which forms part of an electronic control system of the optical lithographic device according to FIG. 4.
Figure 7B:
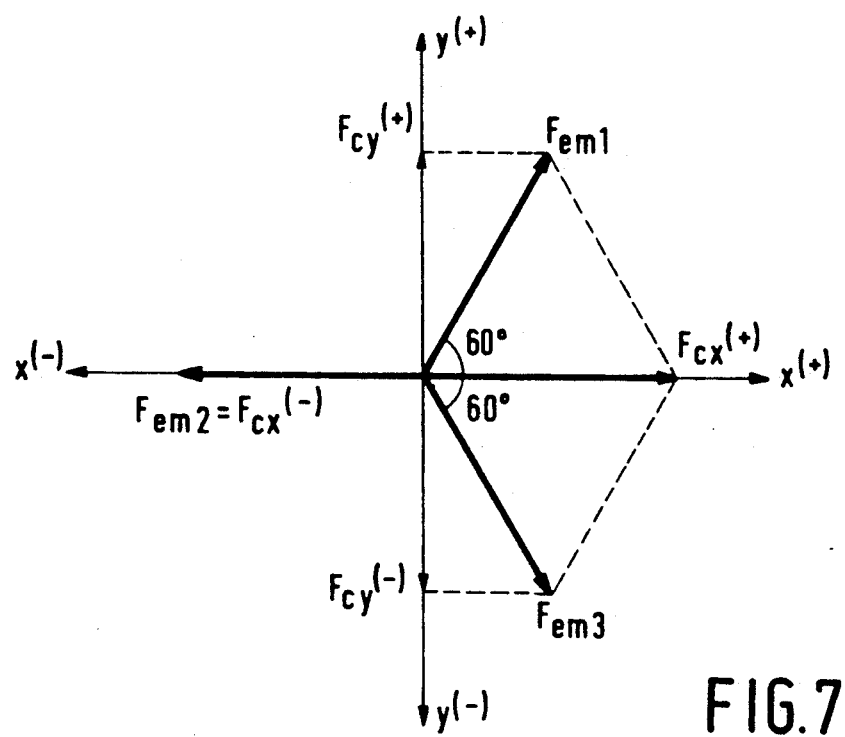
FIG. 7b shows a diagram of forces of a force actuator system of the optical lithographic device of FIG. 4.

In FIG. 7a, the summation circuit 177 is shown in detail, while FIG. 7b shows a forces diagram for the electromagnetic forces $F_{em1}$, $F_{em2}$ and $F_{em3}$. As is apparent from FIG. 7b, a compensatory force $F_{cx}^{(+)}$ in the positive x-direction is obtained through superimposition of the forces $F_{em1}$ and $F_{em3}$, the force $F_{em2}$ being zero and the forces $F_{em1}$ and $F_{em3}$ each having a value which is equal to the desired force $F_{cx}^{(+)}$. In the summation circuit 177 depicted in FIG. 7a, therefore, the input signal $u_{fx+}$ is conducted through a branch 179 to an adder 181 which has the signal $u_{f1}$ as an output signal, and through a branch 183 to an adder 185 which has the signal $u_{f3}$ as an output signal. It is also apparent from FIG. 7b that a compensatory force $F_{cx}^{(-)}$ in the negative x-direction is obtained by means of the force $F_{em2}$, the forces $F_{em1}$ and $F_{em3}$ being zero. In the summation circuit 177 (see FIG. 7a), therefore, the input signal $u_{fx-}$ is conducted to an adder 187 only, which has the signal $u_{f2}$ as an output signal. A compensatory force $F_{cy}{}^{(+)}$ in the positive y-direction is obtained by superimposition of the forces $F_{em1}$ and $F_{em2}$, the force $F_{em3}$ being zero and the forces $F_{em1}$ and $F_{em2}$ being greater than the desired force $F_{cy}{}^{(+)}$ by a factor $2/\sqrt{3}$ and a factor $1/\sqrt{3}$, respectively. In the summation circuit 177, accordingly, the input signal $u_{fy+}$ is conducted through a branch 189 to the adder 181 and through a branch 191 to the adder 187, the branch 189 comprising an amplifier 193 which multiplies the signal $u_{fy+}$ by a factor $2/\sqrt{3}$, and the branch 191 comprising an amplifier 195 which multiplies the signal $u_{fy+}$ by a factor $1/\sqrt{3}$. Finally, FIG. 7b shows that a compensatory force $F_{cy}{}^{(-)}$ in the negative y-direction is obtained through superimposition of the forces $F_{em2}$ and $F_{em3}$, the force $F_{em1}$ being zero and the forces $F_{em2}$ and $F_{em3}$ being greater than the desired force $F_{cy}{}^{(-)}$ by a factor $1/\sqrt{3}$ and a factor $2/\sqrt{3}$, respectively. Accordingly, the input signal $u_{fy-}$ in the summation circuit 177 is conducted through a branch 197 to the adder 187 and through a branch 199 to the adder 185, the branch 197 comprising an amplifier 201 which multiplies the signal $u_{fy-}$ by a factor $1/\sqrt{3}$, and the branch 199 comprising an amplifier 203 which multiplies the signal $u_{fy-}$ by a factor $2/\sqrt{3}$.

Figure 8:
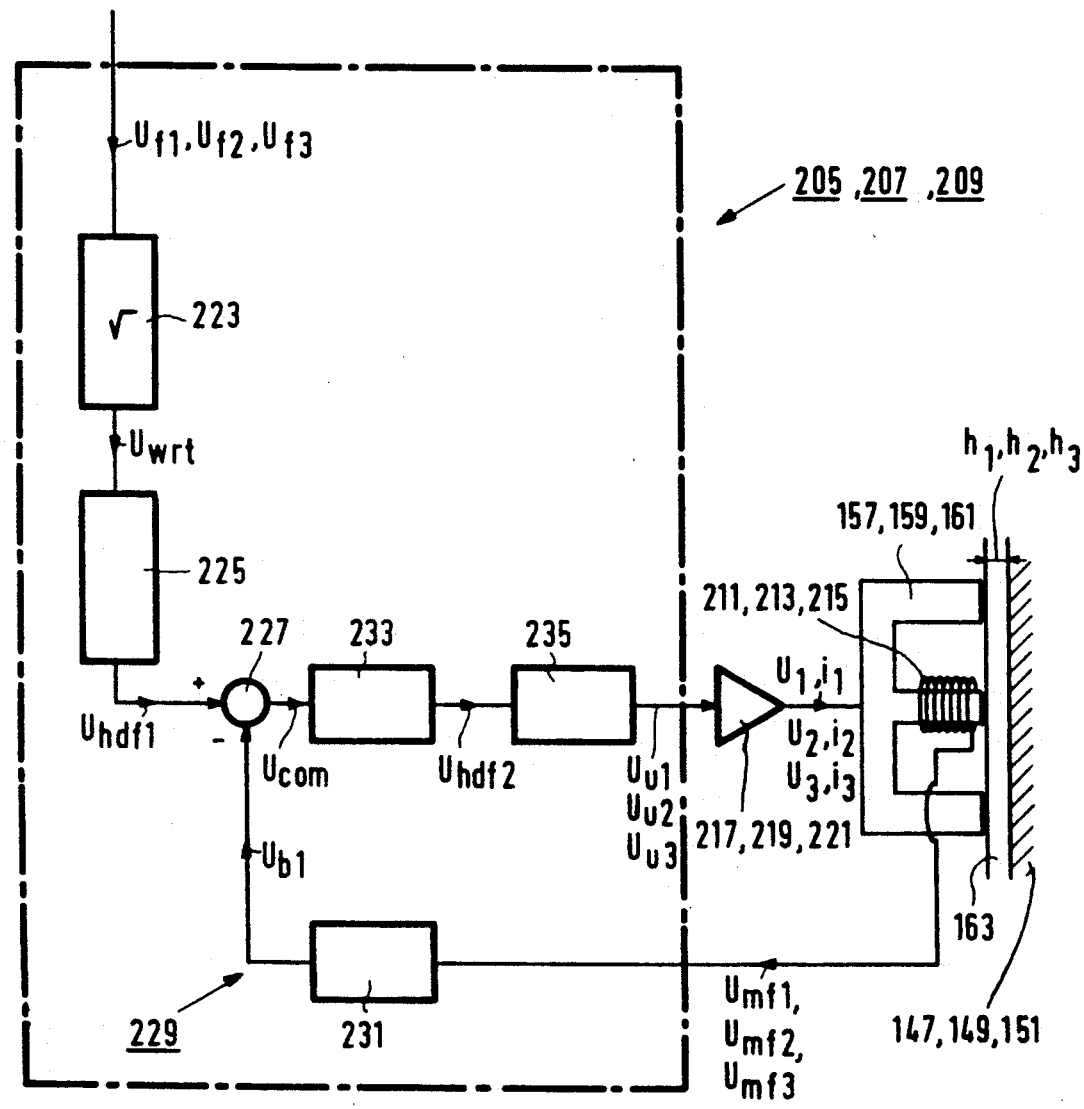
FIG. 8 shows an electronic control circuit which forms part of an electronic control system of the optical lithographic device of FIG. 4.

The value of the electromagnetic force exerted by each of the electromagnets 157, 159 and 161 is regarded as proportional to the square of the value of an electric current through the relevant electromagnet 157, 159, 161 and inversely proportional to the square of the size of the air gap 163. If the size of the air gap 163 changes owing to a small movement of the carrier 139 relative to the base 131, the value of the electromagnetic force will change unless further measures are taken. The use of the electromagnets 157, 159 and 161 as force actuators, whereby each of the electromagnets 157, 159 and 161 exerts a force on the base 131 whose value is determined by the controller 167 of the control system 165, is accordingly only possible if the current through the electromagnets 157, 159 and 161 is controlled. As is shown in FIG. 6, the control system 165 is for this purpose provided with three identical electronic control circuits 205, 207 and 209 by means of which an electric voltage $u_1$, $u_2$ and $u_3$ across the electromagnets 157, 159 and 161, respectively, is controlled. The control circuits 205, 207 and 209 have for their input signals the signals $u_{f1}$, $u_{f2}$ and $u_{f3}$, respectively. Further input signals of the control circuits 205, 207 and 209 are formed by the signals $u_{mf1}$, $u_{mf2}$ and $u_{mf3}$ (voltage signals), respectively, which are output signals of a magnetic flux density transducer 211 of the electromagnet 157, a magnetic flux density transducer 213 of the electromagnet 159, and a magnetic flux density transducer 215 of the electromagnet 161, respectively, as shown in FIG. 8. An output signal $u_{u1}$ of the control circuit 205 (voltage signal) is amplified by an amplifier unit 217 to the voltage $u_1$ which determines a current $i_1$ through the electromagnet 157. Similarly, an output signal $u_{u2}$ of the control circuit 207 is amplified by an amplifier unit 219 to the voltage $u_2$ which determines a current $i_2$ through the electromagnet 159, while an output signal $u_{u3}$ of the control circuit 209 is amplified by an amplifier unit 221 to a voltage $u_3$ which determines a current $i_3$ through the electromagnet 161.

FIG. 8 diagrammatically shows the electronic control circuit 205 of the electromagnet 157. The control circuits 207 and 209 are constructed in an identical manner. As is shown in FIG. 8, the input signal $u_{f1}$ of the control circuit 205, which has a value proportional to the force $F_{em1}$ to be exerted by the electromagnet 157, is offered to an electronic root extractor 223. An output signal $u_{sqr}$ of the root extractor 223 (voltage signal) has a value equal to the square root of the signal $u_{f1}$:

$$u_{sqr} = \sqrt{u_{f1}}$$

An electrical output of the root extractor 223 is connected to an electrical input of a first electronic high-pass filter 225 with an output signal $u_{hdf1}$. The function of the first high-pass filter 225 in the control circuit 205 is explained in more detail below.

As is shown in FIG. 8, the signal $u_{hdf1}$ is offered to a first electrical input of a comparator 227. A second electrical input of the comparator 227 is connected via a negative feedback line 229 to an electrical output of the magnetic flux density transducer 211 which is formed by a secondary electric coil of the electromagnet 157. The output signal $u_{mf1}$ of the flux density transducer 211 (voltage signal) is determined by a voltage induced by the electromagnetic field of the electromagnet 157 in the secondary coil, and its value is regarded as proportional to a change in the value of the magnetic flux density $B_{m1}$ in the air gap 163 of the electromagnet 157:

$$u_{mf1} = C_{transducer}(\delta B_{m1}/\delta t)$$

In this expression, $C_{transducer}$ is a constant factor which is determined by a number of properties of the flux density transducer 211 such as, for example, the number of turns of the secondary electric coil. The magnetic flux density $B_{m1}$ in the air gap 163 is regarded as proportional to the value of the current $i_1$ through the electromagnet 157 and inversely proportional to the size of the air gap 163, so that the force $F_{em1}$ exerted by the electromagnet 157 is proportional to the square of the value of the magnetic flux density $B_{m1}$:

$$B_{m1} = C_{magnet1} \cdot (i_1/h_1)$$

$$F_{em1} = C_{magnet2} \cdot (B_{m1})^2$$

$$B_{m1} = \sqrt{(F_{em1}/C_{magnet2})}$$

In these expressions, $C_{magnet1}$ and $C_{magnet2}$ are constant factors which are determined by a number of properties of the electromagnet 157 such as, for example, the number of turns of the electromagnet 157 and the magnetic permeability of the magnet iron used in the electromagnet 157. Furthermore, $h_1$ is the size of the air gap 163, as is indicated in FIG. 8.

FIG. 8 also shows that the negative feedback line 229 comprises an electronic integrator 231 by means of which the output signal $u_{mf1}$ of the flux density transducer 211 is integrated to a signal $u_{b1}$ whose value is proportional to the magnetic flux density $B_{m1}$. The input signal $u_{b1}$ of the comparator 227, therefore, is a signal whose value is proportional to a measured value of the flux density $B_{m1}$, while the input signal $u_{hdf1}$, whose value is equal to the square root of the desired force $F_{em1}$, is proportional to a desired value of the flux density $B_{m1}$. An output signal $u_{com}$ of the comparator 227 is equal to the difference $u_{hdf1}-u_{b1}$ of the two input signals of the comparator 227.

As was noted above, the signal $u_{mf1}$ is integrated to the signal $u_{b1}$ by means of the electronic integrator 231. The integrating function of such an integrator is not ideal and takes place over only a finite time interval. As a result, especially at very low-frequency input signals $u_{mf1}$ ($<10^{-4}$ Hz), inaccuracies in the output signal $u_{b1}$ arise which lead to an inaccurate operation of the control circuit 205. To prevent such an inaccurate operation of the control circuit 205, the control circuit 205 is provided with the said first high-pass filter 225 by means of which very low-frequency components of the input signal $u_{f1}$ are filtered out, and with a second high-pass filter 233 with an output signal $u_{hdf2}$, of which an electrical input is connected to an electrical output of the comparator 227 and by means of which very low-frequency components of the output signal $u_{com}$ are filtered out.

As is shown in FIG. 8, the output signal $u_{hdf2}$ is offered to an electronic controller 235 with a proportional control action (amplification factor $K_p$=the order of 100). The output signal $u_{u1}$ of the controller 235 has a value equal to $K_p \cdot u_{hdf2}$ and is represented in FIG. 6 as the output signal of the control circuit 205. When during operation a difference arises between the desired value of the flux density $B_{m1}$ (signal $u_{hdf1}$) and the measured value of the flux density $B_{m1}$ (signal $u_{b1}$), the voltage $u_1$ across the elecromagnet 157 will be so adapted by the proportional control action of the controller 235 that an equilibrium state is created in which the desired and the measured flux densities in the air gap 163 are substantially equal. Since the value of the force $F_{em1}$ exerted by the electromagnet 157 is proportional to the square of the value of the flux density $B_{m1}$, it is achieved through the use of the root extractor 223 that the force $F_{em1}$ has a value proportional to the input signal $u_{f1}$ of the control circuit 205. Thus the electromagnet 157 controlled by the control circuit 205 forms a linear force actuator. The electromagnetic force is thereby independent of the size of the air gap 163, so that mechanical vibrations of the base 131 cannot be passed on through the electromagnets 157, 159 and 161 to the carrier 139. Furthermore, the use of the electromagnets 157, 159 and 161 provides a force actuator system 155 which is free from mechanical wear.

It is noted that undesirable movements of the machine frame 1 in the x-direction and the y-direction and an undesirable rotational movement of the machine frame 1 about the main axis 13 can be prevented by means of the force actuator system 67 and the acceleration transducers 111, 113 and 115 in the first embodiment of the optical lithographic device shown in FIGS. 1 to 3. The use of a greater number of force actuators and acceleration transducers renders it possible also to prevent undesirable movements in the z-direction and/or rotational movements about an axis of rotation parallel to the x-direction or the y-direction. An adapted control system will then have to be used for the force actuator system.

It is further noted that the force actuator system 155 exclusively exerts a compensatory force on the machine frame 1 in the x-direction and in the y-direction, which force has a value equal to the reaction force exerted on the carrier 139 in the relevant direction by the positioning device 35 in the second embodiment of the optical lithographic device pictured in FIGS. 4 to 8. By providing the control system 165 with a negative feedback from the acceleration transducers fastened to the carrier 139, it is possible to have the force actuator system 155 also prevent undesirable movements in the said directions which are caused by forces other than the reaction forces mentioned. Furthermore, other undesirable movements of the machine frame 1 may also be prevented in the second embodiment through the use of a greater number of electromagnets, such as, for example, a rotational movement about the optical main axis 13. It was found in practice, however, that the accuracy of the device is adversely affected mainly by undesirable movements of the carrier 139 relative to the lens system 11 in the x- and y-directions. A compact and simple force actuator system 155 is provided here through the use of only three electromagnets 157, 159 and 161.

It is also noted that, in the first embodiment of the optical lithographic device shown in FIGS. 1 to 3, instead of a force actuator system 67 an alternative force actuator system with electromagnets may be used, in which each of the force actuators 69, 71 and 73 is replaced by a pair of electromagnets which face one another in the relevant direction, or by a single electromagnet active in the relevant direction and cooperating with a pretensioning member such as, for example, a permanent magnet or a mechanical spring. In the second embodiment of the optical lithographic device shown in FIGS. 4 to 8, a force actuator system may be used which is provided with three force actuators corresponding to the force actuators 69, 71 and 73 used in the first embodiment instead of the force actuator system 155. The connecting rods 85 are then, for example, each directed parallel to one of the main sides 141 of the carrier 139.

It is further noted that, instead of the magnetic flux density transducer 211, a Hall transducer, which is known per se, may alternatively be used in the control circuit 205 shown in FIG. 8. An output signal of such a Hall transducer has a value proportional to the magnetic flux density $B_m$, so that the use of a Hall transducer renders the integrator 231 and the high-pass filters 225 and 233 redundant. In many cases, however, the use of a Hall transducer is disadvantageous in view of the mounting space required.

It is also noted that the force actuator system 67, 155 described above may also be used in an optical lithographic device in which each integrated circuit on a substrate is illuminated portion by portion. In such an optical lithographic device, which has a comparatively compact lens system, the lens system is fastened to the machine frame, while the support member with the positioning device and the mask manipulator are provided on a carrier which is movable relative to the lens system and the machine frame. The reaction forces exerted by the positioning device on the support member are transmitted through the carrier to the machine frame in such a device and cause undesirable movements of the lens system relative to the object table. Undesirable movements of the lens system relative to the object table arise in such a device in addition during a displacement of the carrier relative to the machine frame. Such undesirable movements can be reduced through the use of a force actuator system which is fastened to a reference frame and which exerts a compensatory force or a control force on the machine frame.

It is finally noted that the two embodiments of the optical lithographic device according to the invention described above are eminently suitable for illuminating semiconductor substrates during the production of integrated electronic circuits. Such a device, however, can also be used in the manufacture of other products provided with structures having detail dimensions in the micrometer range, where mask patterns are to be imaged on a substrate by means of the device. Examples are structures of integrated optical systems, conductor and detection patterns of magnetic domain memories, and structures of liquid crystal imaging patterns.

We claim:

1. An optical lithographic device with a lens system which has a vertical optical main axis directed parallel to a z-direction and which is fastened to a machine frame of the device, a positioning device which is situated below the lens system and by means of which an object table is displaceable relative to the lens system over a guide surface of a support member coupled to the positioning device, which guide surface extends perpendicular to the z-direction, a force actuator system which is fastened to a reference frame of the device and is controlled by a feedforward control system, the force actuator system comprising means for exerting during operation a compensatory force on the machine frame with a direction which is opposed to a direction of a reaction force exerted simultaneously on the support member by the positioning device, and with a value which is substantially equal to a value of the said reaction force.

2. An optical lithographic device as claimed in claim 1, in which the support member forms a base of the machine frame, the force actuator system comprising means for exerting the compensatory force on the support member.

3. An optical lithographic device as claimed in claim 1, in which the lens system is fastened near a lower side to a mounting member belonging to the machine frame, the force actuator system comprising means for exerting the compensatory force on a carrier suspended from the mounting member, on which carrier the positioning device and the support member have been provided as a unit.

4. An optical lithographic device as claimed in claim 3, wherein the reference frame is formed by a base of the optical lithographic device on which the mounting member is fastened by means of lower frame supports.

5. An optical lithographic device as claimed in claim 1, wherein the control system comprises a negative acceleration feedback, and the force actuator system comprises means for exerting a control force on the machine frame which has a value and a direction which are determined by an acceleration of the machine frame measured by means of an acceleration transducer.

6. An optical lithographic device as claimed in claim 1, wherein the force actuator system comprises a first and a second force actuator which each act parallel to a first displacement direction of the positioning device perpendicular to the optical main axis, and a third force actuator which acts parallel to a second displacement direction of the positioning device perpendicular to the optical main axis and perpendicular to the first displacement direction.

7. An optical lithographic device as claimed in claim 6, wherein each of the force actuators is provided with an electric motor fastened to the reference frame and with a connecting rod extending parallel to the relevant displacement direction, a first rod end being eccentrically pivoted to an output shaft of the electric motor and a second rod end being pivoted to the machine frame.

8. An optical lithographic device as claimed in claim 1, wherein the force actuator system comprises at least one electromagnet with a magnetic flux density transducer, an electrical output of the magnetic flux density transducer being connected to an electrical input of an electronic control circuit with which a force exerted by the electromagnet is controllable.

9. An optical lithographic device as claimed in claim 8, wherein the control circuit is provided with an electronic root extractor whose input signal is formed by an input signal of the control circuit and has a value which is determined by a desired electromagnetic force to be exerted by the electromagnet.

10. An optical lithographic device as claimed in claim 8, wherein the force actuator system comprises three electromagnets which are fastened to the reference frame of the device in a triangular arrangement in a plane perpendicular to the optical main axis, each of the electromagnets being active in a direction which is 120° rotated relative to the directions in which the other two electromagnets of the force actuator system are active.

* * * * *